(12) United States Patent
Fu et al.

(10) Patent No.: US 7,384,729 B2
(45) Date of Patent: Jun. 10, 2008

(54) METHOD OF MANUFACTURING A LIGA MOLD BY BACKSIDE EXPOSURE

(75) Inventors: Chien-Chung Fu, Hsinchu (TW); Heng-Chi Huang, Jhudong Township, Hsinchu County (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 11/446,111

(22) Filed: Jun. 5, 2006

(65) Prior Publication Data

US 2006/0275711 A1 Dec. 7, 2006

(30) Foreign Application Priority Data

Jun. 7, 2005 (TW) ............................... 94118691 A

(51) Int. Cl.
*G03F 7/20* (2006.01)

(52) U.S. Cl. ...................................... 430/320; 430/324

(58) Field of Classification Search ..................... None
See application file for complete search history.

(56) References Cited

U.S. PATENT DOCUMENTS 5,772,905 A 6/1998 Chou

2001/0054778 A1 12/2001 Unger et al.

FOREIGN PATENT DOCUMENTS

| JP | 11-236694 A | * | 8/1999 |
| JP | 2004-255680 A | * | 9/2004 |
| JP | 2005-343115 A | * | 12/2005 |
| TW | 593125 | | 8/1991 |
| TW | 560028 | | 10/1991 |

* cited by examiner

*Primary Examiner*—John A. McPherson
(74) *Attorney, Agent, or Firm*—Muncy, Geissler, Olds & Lowe, PLLC

(57) ABSTRACT

A mold manufacturing method includes the steps of: disposing a mask layer on a front side and a backside of a first substrate, wherein the first substrate is transparent to a predetermined light source and the mask layer has a top portion and a bottom portion, which are respectively disposed on the front side and the backside and arranged alternately; forming a photoresist layer on the front side of the first substrate; providing the predetermined light source to illuminate the backside of the first substrate so as to expose the photoresist layer to form an exposed portion and an unexposed portion; and removing the unexposed portion to form a patterned structure having trenches and microholes arranged alternately; forming a metal layer on the patterned structure of the photoresist layer and the first substrate; and removing the photoresist layer and the first substrate; to remain the metal layer.

9 Claims, 6 Drawing Sheets

METHOD OF MANUFACTURING A LIGA MOLD BY BACKSIDE EXPOSURE

BACKGROUND OF THE INVENTION

1. Field of the Invention

The invention relates to a method of manufacturing a LIGA mold, and more particularly to a method of manufacturing a LIGA mold by backside exposure.

2. Description of the Related Art

LIGA is the abbreviation of German "Lithographie, Galvanoformung und Abformung", which means lithography, electroplating and molding. The LIGA process uses a mask and the X-ray having high linearity but requiring synchronous radiation to manufacture a micro structure having a pattern with a high aspect ratio (e.g., 50:1 or larger), wherein the fabricated micro structure may be an end product or a mold for proceeding the molding process such as hot embossing.

FIGS. 1A to 1C show conventional LIGA processes using the X-ray in the case of using a negative photoresist (e.g., SU-8). As shown in FIG. 1A, a seed layer 120 is deposited on a substrate 110. Then, a photoresist layer 130 is applied onto the seed layer 120 by way of spin coating. Next, a mask layer 140 is provided or formed on the photoresist layer 130. Then, an X-ray source 150 for illumination is provided to form the photoresist layer 130 with the patterned structure of FIG. 1A.

Then, as shown in FIG 1B, a metal layer 160 is formed on the seed layer 120 by way of plating. Next, the photoresist layer 130, the seed layer 120 and the substrate 110 are removed to remain the metal layer 160 as a mold. The mold can be used to perform the hot embossing process. Due to the excellent optical property of the X-ray, a sidewall of the patterned structure formed on the photoresist layer 130 is substantially vertical. In addition, the surface of the sidewall of the formed photoresist layer 130 is very smooth such that the surface of the formed mold is very smooth, which is advantageous to the de-molding procedure of the hot embossing process and is thus advantageous to the mass production. However, the X-ray source cannot be easily obtained and a synchronous radiation apparatus is needed, so the cost of the LIGA process using the X-ray cannot be effectively reduced.

FIGS. 2A to 2C show conventional LIGA processes using the ultra-violet light. As shown in FIGS. 2A to 2C, the photoresist layer 130, which is large in top and small in bottom, is formed when the ultra-violet light source 150' is used to replace the X-ray source of FIG. 1A by way of front side exposure due to the Fresnel diffraction effect of the light and the absorption property of the photoresist. That is, an upper area 132 of the photoresist layer 130 is larger than a lower area 134 thereof. Thus, the manufactured mold 160 is disadvantageous to the de-molding procedure of the hot embossing process.

Consequently, it is an important subject of the invention to provide a method of forming a LIGA mold, which is advantageous to the de-molding procedure of the hot embossing process, by LIGA processes using the ultra-violet light.

SUMMARY OF THE INVENTION

It is therefore an object of the invention to provide a method of manufacturing a LIGA mold by backside exposure so as to manufacture a mold advantageous to the de-molding procedure of the hot embossing process and to reduce the cost in mass production.

The invention achieves the above-identified object by providing a method of manufacturing a mold by backside exposure. The method includes the steps of: (a) disposing a mask layer on two opposite sides of a first substrate, wherein the first substrate is transparent to a predetermined light source and has a front side and a backside, which are the two opposite sides, and the mask layer has a top portion and a bottom portion respectively disposed on the two opposite sides of the first substrate, and the top portion and the bottom portion are arranged alternately; (b) forming a photoresist layer on the front side of the first substrate; (c) providing the predetermined light source to illuminate the backside of the first substrate so as to expose the photoresist layer to form an exposed portion and an unexposed portion; and (d) removing the unexposed portion to form a patterned structure having trenches and micro-holes arranged alternately; and the method may further include the steps of: (e) forming a metal layer on the patterned structure of the photoresist layer and the first substrate; and (f) removing the photoresist layer and the first substrate to remain the metal layer.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
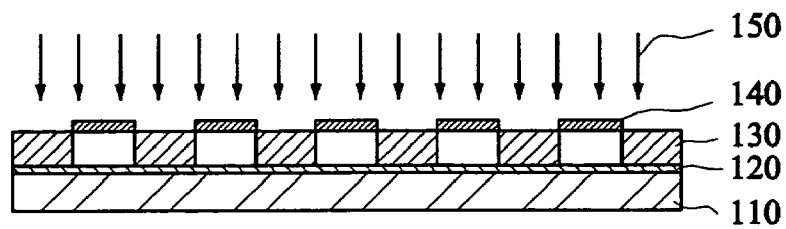
FIGS. 1A to 1C show conventional LIGA processes using the X-ray.
Figure 1B:
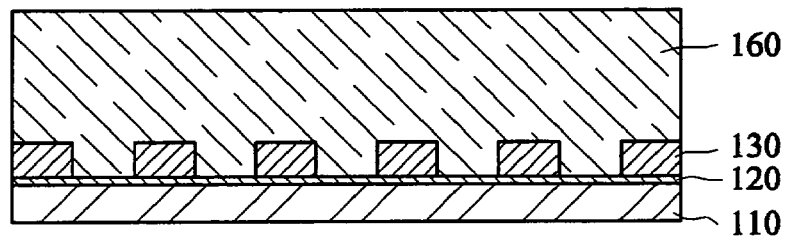
Figure 1C:
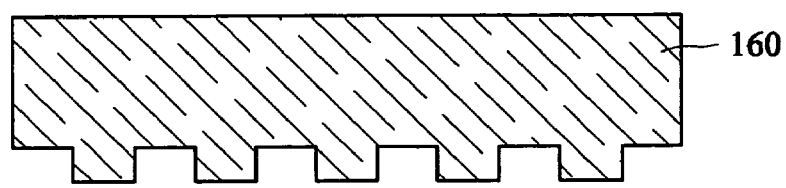
Figure 2A:
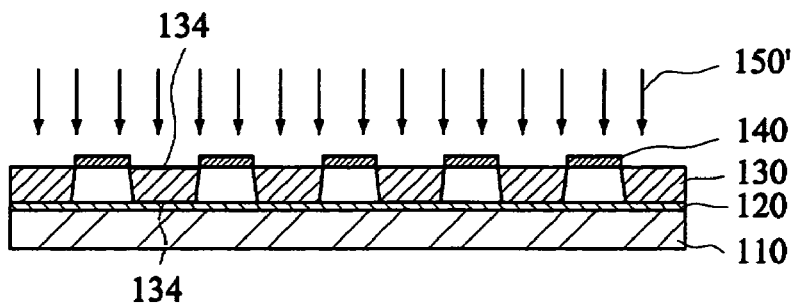
FIGS. 2A to 2C show conventional LIGA processes using the ultra-violet light.
Figure 2B:
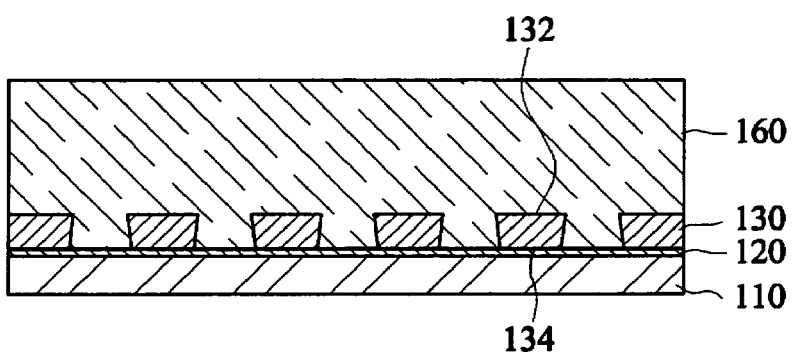
Figure 2C:
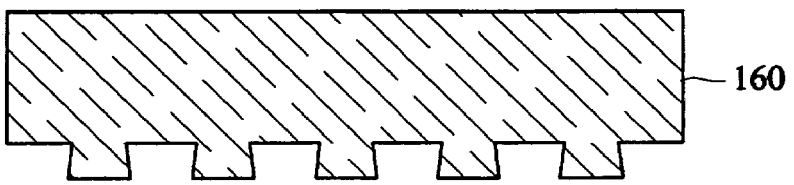
Figure 3A:
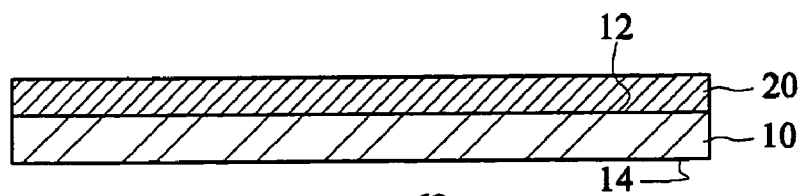
FIGS. 3A to 3G are schematic illustrations showing a method of manufacturing a LIGA mold by backside exposure according to a first embodiment of the invention.
Figure 3B:
Figure 3C:
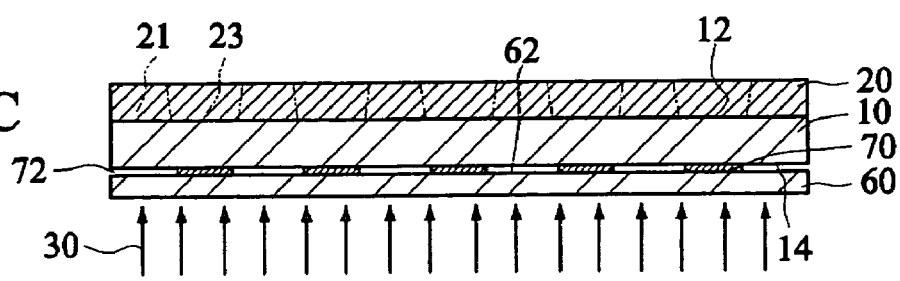
Figure 3D:
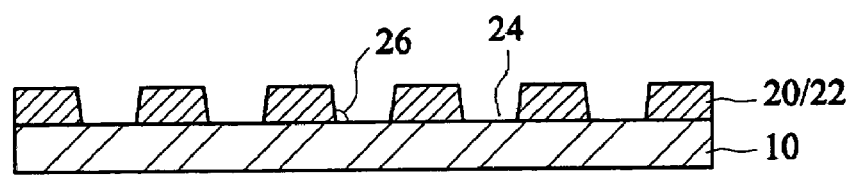

FIGS. 3A to 3G are schematic illustrations showing a method of manufacturing a LIGA mold by backside exposure according to a first embodiment of the invention. As shown in FIG. 3A, a first substrate 10, which is transparent to a predetermined light source and has a front side 12 and a backside 14, is provided. The predetermined light source may be, for example, an ultra-violet light source, a laser source, an excimer laser source, an X-ray or synchronous radiation X-ray source. The first substrate may be made of, for example, quartz, soda glass, a polymeric material, a cyclo olefin copolymer (COC) or silicon. Then, a photoresist layer 20 is formed on a side (e.g., the front side 12) of the first substrate 10 by way of, for example, spin coating. In this embodiment, the photoresist layer 20 is a negative photoresist layer made of, for example, an SU-8 resist, and the predetermined light source is the ultra-violet light source. Then, a mask layer 70 is disposed on a side of the first substrate 10. The mask layer 70 may be made of a metal material including, for example, chromium, chromium dioxide, gold, aluminum, titanium, copper, nickel, or a nickel-cobalt alloy. The mask layer 70 may be formed independently of the formations of the first substrate 10 and the photoresist layer 20, and then disposed on one side of the first substrate 10. In this embodiment, as shown in FIG. 3B, the mask layer 70 is formed on a second substrate 60 which is transparent to the predetermined light source. Then, as shown in FIG. 3B, the mask layer 70 is disposed on the backside 14 of the first substrate 10 with the mask layer 70 in contact with the backside 14 of the first substrate 10. At this time, a front side 62 of the second substrate 60 and the backside 14 of the first substrate 10 are separated by the mask layer 70 by a gap 72. The predetermined light source (e.g., the ultra-violet light source with I-line or G-line) 30 illuminates the backside 14 of the first substrate 10 through the second substrate 60 so as to expose the photoresist layer 20 to form an exposed portion 21 and an unexposed portion 23, as shown in FIG. 3C. Then, the unexposed portion 23 is removed by, for example, development to form a patterned structure 22, as shown in FIG. 3D. The patterned structure 22 includes a plurality of trenches 24. Through the effect of the Fresnel diffraction and the light absorption property of the photoresist 20, each of the two base angles 26 of the trench 24 are larger than 90 degrees. So, the mold manufactured using the patterned structure is advantageous to the de-molding procedure of the hot embossing process.

Figure 3E:
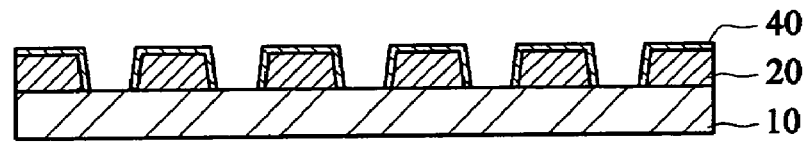
Figure 3F:
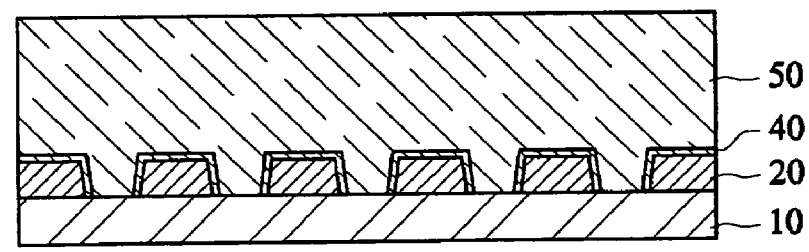
Figure 3G:
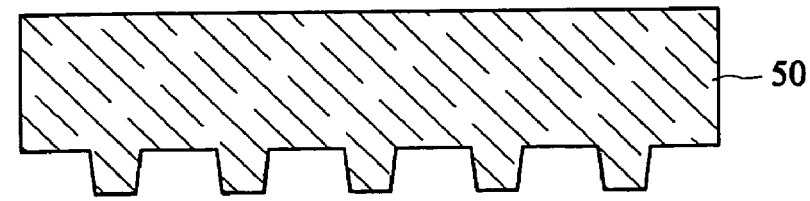

Next, as shown in FIG. 3E, a seed layer 40 is deposited on the photoresist layer 20 and the first substrate 10. Then, as shown in FIG. 3F, a metal layer 50, which is made of nickel or a nickel-cobalt alloy, for example, is formed on the seed layer 40. Alternatively, it is possible to form the metal layer 50 on the patterned structure 22 of the photoresist layer 20 and the first substrate 10 by other methods. Next, as shown in FIG. 3G, the seed layer 40, the photoresist layer 20 and the first substrate 10 are removed to remain the metal layer 50 as the LIGA mold. Adjusting the thickness of the first substrate 10 can adjust the base angle 26 and thus adjust the de-molding angle of the LIGA mold.

Figure 4A:
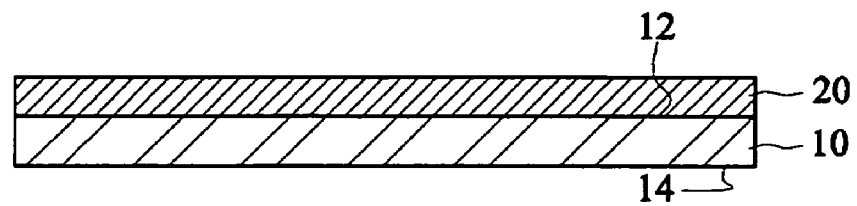
FIGS. 4A to 4C are schematic illustrations partially showing a method of manufacturing a LIGA mold by backside exposure according to a second embodiment of the invention.
Figure 4B:
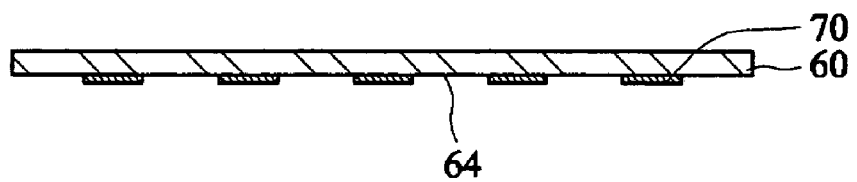
Figure 4C:
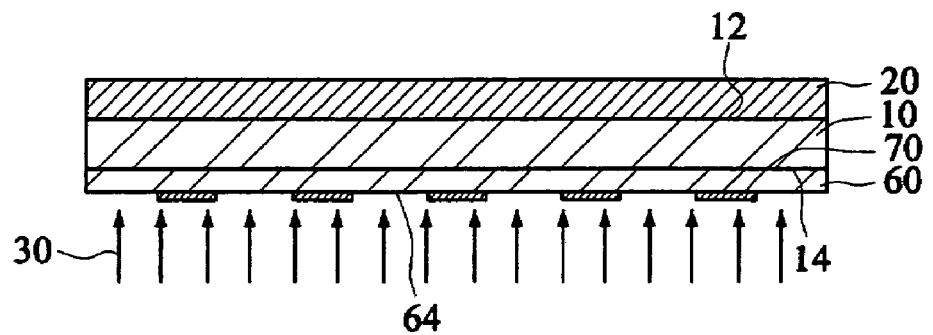

FIGS. 4A to 4C are schematic illustrations partially showing a method of manufacturing a LIGA mold by backside exposure according to a second embodiment of the invention. As shown in FIG. 4A to 4C, this embodiment is similar to the first embodiment except that the mask layer 70 is formed on a backside 64 of the second substrate 60. Then, the mask layer 70 is disposed on the backside 14 of the first substrate 10 with the front side 62 of the second substrate 60 in contact with the backside 14 of the first substrate 10. At this time, no gap exists between the first substrate 10 and the second substrate 60.

Figure 5:
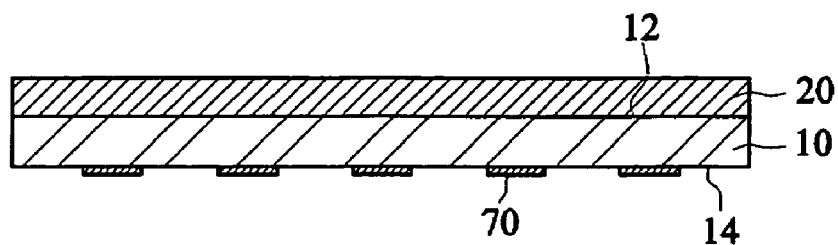
FIG. 5 is a schematic illustration partially showing a method of manufacturing a LIGA mold by backside exposure according to a third embodiment of the invention.

FIG. 5 is a schematic illustration partially showing a method of manufacturing a LIGA mold by backside exposure according to a third embodiment of the invention. As shown in FIG. 5, the mask layer 70 is formed on the backside 14 of the first substrate 10. The mask layer 70 may be formed before or after the photoresist layer 20 is formed.

Figure 6A:
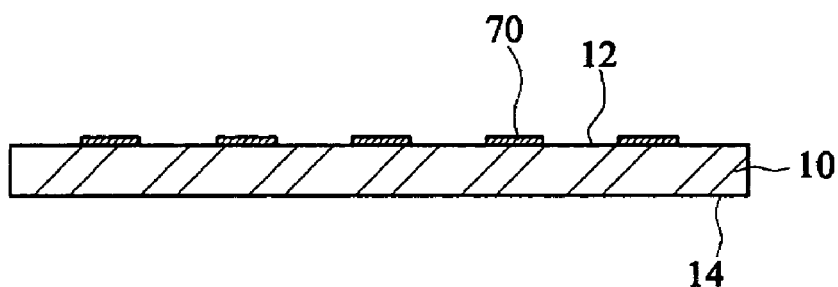
FIGS. 6A and 6B are schematic illustration partially showing a method of manufacturing a LIGA mold by backside exposure according to a fourth embodiment of the invention.
Figure 6B:
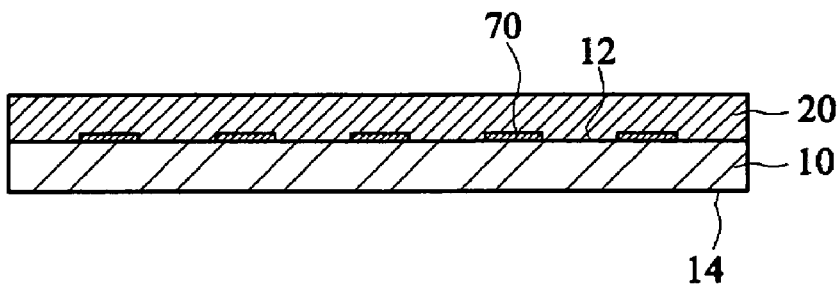

FIGS. 6A and 6B are schematic illustration partially showing a method of manufacturing a LIGA mold by backside exposure according to a fourth embodiment of the invention. As shown in FIGS. 6A and 6B, the mask layer 70 is formed on the front side 12 of the first substrate 10. Then, the photoresist layer 20 is formed on the first substrate 10.

Figure 7A:
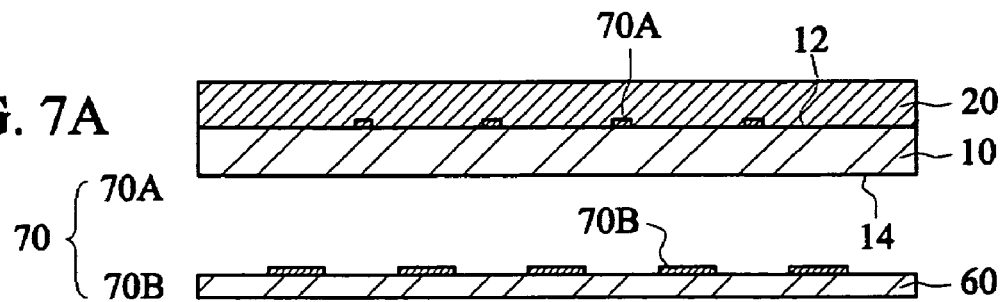
FIGS. 7A to 7C are schematic illustrations partially showing a method of manufacturing a LIGA mold by backside exposure according to a fifth embodiment of the invention.
Figure 7B:
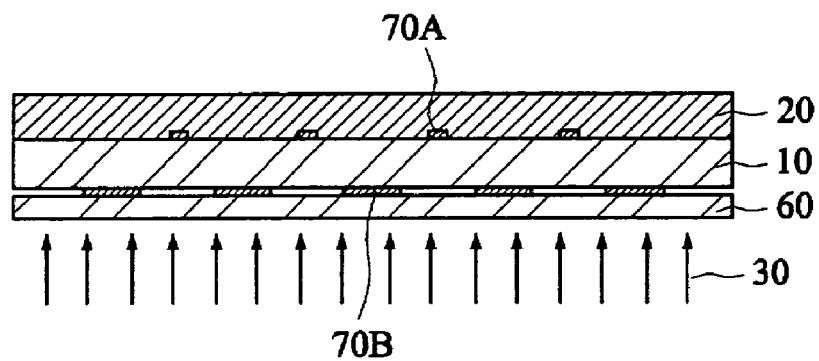
Figure 7C:
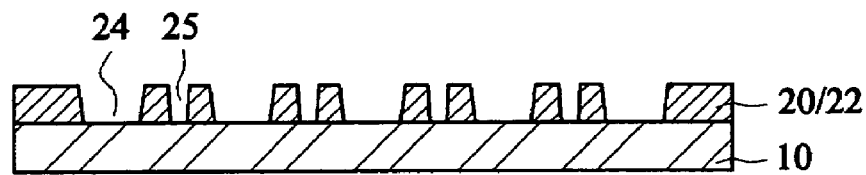

FIGS. 7A to 7C are schematic illustrations partially showing a method of manufacturing a LIGA mold by backside exposure according to a fifth embodiment of the invention. As shown in FIG. 7A, the mask layer 70 is disposed on the front side 12 and the backside 14 of the first substrate 10. Specifically speaking, a top portion 70A of the mask layer 70 is formed on the front side 12 of the first substrate 10, while a bottom portion 70B of the mask layer 70 is formed on the second substrate 60, wherein the top portion 70A and the bottom portion 70B are arranged alternately. Then, as shown in FIG. 7B, the bottom portion 70B of the mask layer 70 on the second substrate 60 is disposed on the backside of the first substrate 10, and the ultra-violet light source 30 is provided to illuminate from the backside 14 of the first substrate 10 to the front side 12 so as to expose the photoresist layer 20 to form an exposed portion (not shown) and an unexposed portion (not shown). Then, the unexposed portion is removed to form a patterned structure having trenches 24 and micro-holes 25 arranged alternately; According to this combination, it is possible to form various patterned structures 22 of photoresist layers 20, as shown in FIG. 7C. The formed trenches 24 and micro-holes 25 enable the individual patterned structure 22 of the photoresist layer 20 to serve as a micro-needle array, which may be applied to the biometrics test or inspection.

According to the embodiments of the invention, the method of forming the LIGA mold by backside exposure enables the formed mold to be effectively applied to the hot embossing process, in which the de-molding procedure is free from the prior art problems. In addition, the method using the ultra-violet light source can reduce the cost and be substantially compatible to the semiconductor process, which contributes to the mass production and the cost reduction.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A mold manufacturing method, comprising the steps of:
   (a) disposing a mask layer on two opposite sides of a first substrate, wherein the first substrate is transparent to a predetermined light source and has a front side and a backside, which are the two opposite sides, and the mask layer has a top portion and a bottom portion respectively disposed on the two opposite sides of the first substrate, and the top portion and the bottom portion are arranged alternately;
   (b) forming a photoresist layer on the front side of the first substrate;
   (c) providing the predetermined light source to illuminate the backside of the first substrate so as to expose the photoresist layer to form an exposed portion and an unexposed portion; and
   (d) removing the unexposed portion to form a patterned structure having trenches and micro-holes arranged alternately;
   (e) forming a metal layer on the patterned structure of the photoresist layer and the first substrate; and
   (f) removing the photoresist layer and the first substrate to remain the metal layer.

2. The method according to claim 1, wherein the predetermined light source is an ultra-violet light source, a laser source, an excimer laser source, an X-ray source or a synchrotron radiation X-ray source.

3. The method according to claim 1, wherein the first substrate is made of quartz, glass, a polymeric material, a cyclo olefin copolymer or silicon.

4. The method according to claim 1, wherein the photoresist layer is a negative photoresist layer.

5. The method according to claim 4, wherein the predetermined light source is perpendicular to the backside of the first substrate.

6. The method according to claim 1, wherein the mask layer is made of a metal material.

7. The method according to claim 6, wherein the metal material comprises chromium, chromium dioxide, gold, aluminum, titanium, copper, nickel, or a nickel-cobalt alloy.

8. The method according to claim 1, wherein step (a) comprises the sub-steps of:
   (a1) forming the bottom portion of the mask layer on a front side of a second substrate, wherein the second substrate is transparent to the predetermined light source; and
   (a2) disposing the bottom portion of the mask layer on the backside of the first substrate with the mask layer in contact with the backside of the first substrate, wherein the front side of the second substrate and the backside of the first substrate are separated by the mask layer by a gap.

9. The method according to claim 8, wherein the second substrate is made of quartz, glass, a polymeric material, a cyclo olefin copolymer or silicon.

* * * * *